United States Patent

Tzu et al.

[11] Patent Number: 6,134,014
[45] Date of Patent: Oct. 17, 2000

[54] APPARATUS AND METHOD OF INSPECTING PHASE SHIFT MASKS USING COMPARISON OF A MASK DIE IMAGE TO THE MASK IMAGE DATABASE

[75] Inventors: San-De Tzu; Shy-Jay Lin, both of Taipei, Taiwan

[73] Assignee: Taiwan Semiconductor Manufacturing Company, Hsin-Chu, Taiwan

[21] Appl. No.: 09/246,892

[22] Filed: Feb. 8, 1999

[51] Int. Cl.$^7$ ..................................................... G01B 9/02
[52] U.S. Cl. ...................... 356/450; 356/239.2; 356/345; 356/352; 356/519
[58] Field of Search ...................... 356/352, 239.1–239.3

[56] References Cited

U.S. PATENT DOCUMENTS

| | | | |
|---|---|---|---|
| 4,579,455 | 4/1986 | Levy et al. | 356/394 |
| 4,805,123 | 2/1989 | Specht et al. | 364/559 |
| 4,926,489 | 5/1990 | Danielson et al. | 382/8 |
| 5,446,540 | 8/1995 | Lin | 356/345 |
| 5,515,189 | 5/1996 | Kuratomi et al. | 359/72 |
| 5,572,598 | 11/1996 | Wihl et al. | 382/144 |
| 5,667,941 | 9/1997 | Okamoto et al. | 430/313 |
| 5,717,204 | 2/1998 | Meisbarger et al. | 250/310 |
| 5,737,072 | 4/1998 | Emery et al. | 356/73 |
| 5,771,097 | 6/1998 | Kusunose et al. | 356/353 |
| 5,789,734 | 8/1998 | Torigoe et al. | 250/201.2 |

*Primary Examiner*—Frank G. Font
*Assistant Examiner*—Phil Natividad
*Attorney, Agent, or Firm*—George O. Saile; Stephen B. Ackerman; Larry J. Prescott

[57] ABSTRACT

A method and apparatus for inspecting photomasks having phase shifting elements which shift the phase of light but are otherwise transparent. A coherent light source is directed through a mask to be inspected, through an objective lens, through an 180° phase shifting unit, and to an image divider. The coherent light source is also directed through a transparent reference substrate to the image divider. The mask to be inspected is formed on a transparent mask substrate having the same thickness and formed from the same material as the transparent reference substrate. The intensity of the light exiting the image divider is proportional to the square of the cosine of 1800 plus the phase angle between the light exiting the reference substrate and the light exiting the mask under test. The light exiting the image divider is directed to a CCD image sensor. An image computer compares the output of the CCD image sensor with an image formed from the image database and identifies defects in the mask under test.

16 Claims, 4 Drawing Sheets

APPARATUS AND METHOD OF INSPECTING PHASE SHIFT MASKS USING COMPARISON OF A MASK DIE IMAGE TO THE MASK IMAGE DATABASE

BACKGROUND OF THE INVENTION (1) Field of the Invention

This invention relates to an apparatus and a method for inspecting masks which comprise transparent phase shifting mask elements using die-to-database inspection and a single image detector.

(2) Description of the Related Art

Inspection of phase shifting mask elements is a problem because defects are not readily apparent in the transparent phase shifting material. Masks can be inspected in a die-to-die mode, where comparisons between two identical die patterns are made, and in a die-to-database mode where comparisons are made between the die pattern and the image database. A method and apparatus which can perform this inspection using die-to-database methods has the advantage of a comparison directly to the design data.

A Patent Application TSMC-97-013; Ser. No. 09/177,340; Filed Oct. 13, 1998; entitled "A NEW APPARATUS AND METHOD FOR INSPECTING PHASE SHIFTING MASKS"; and assigned to the same Assignee describes an apparatus and method for die-to-die inspection of masks having phase shifting elements.

U.S. Pat. No. 5,737,072 to Emery et al. describes a method and apparatus for inspecting masks having phase shifting elements using transmitted and reflected light signals and signals derived from them.

U.S. Pat. No. 5,572,598 to Wihl et al. describes an inspection apparatus for inspecting masks having phase shifting elements which comprises a transmission light detector and a reflected light detector. The apparatus can be used for die-to-die comparison as well as die-to-database comparison.

U.S. Pat. No. 5,717,204 to Meisburger et al. describes an inspection system for masks having phase shifting elements using electron beam microscopy. An electron beam is scanned across the mask and detectors are used to measure the secondary and backscattered charged particles from the surface of the mask.

U.S. Pat. No. 4,926,489 Danielson et al. describes an automatic injection system for inspecting a reticle or photomask.

U.S. Pat. No. 4,805,123 to Specht et al. describes an inspection system for die-to-die system for inspecting a photomask or reticle.

U.S. Pat. No. 4,579,455 to Levy et al. describes an inspection apparatus and method for inspecting photomasks by comparison of duplicate die patterns.

U.S. Pat. No. 5,515,189 to Kuratomi et al. describes an image recognition system for optical masks.

SUMMARY OF THE INVENTION

Masks formed using phase shifting materials find frequent use in photolithographic processing of integrated circuit wafers. As feature sizes have become smaller the masks used in photolithographic processing have made increasing use of phase shifting materials to improve image definition and depth of focus.

The phase shifting materials used in mask fabrication provide a phase shift for light passing through the phase shifting materials relative to light which does not pass through the phase shifting materials, but are otherwise transparent. The amount of phase shift provided to the light depends not only on the materials used but on the thickness of the materials. This transparent nature of the phase shifting materials makes inspection of the masks extremely difficult. Variations in thickness as well as other defects are difficult to detect. Defects in the masks will lead to defects in the integrated circuits fabricated using the masks.

FIG. 1 shows a cross section of a binary mask having a transparent mask substrate 10 and opaque mask elements 12. Since the mask elements in the binary mask are opaque they are relatively easy to inspect.

FIG. 2 shows a cross section of a Levenson type phase shifting mask having a transparent mask substrate 10, opaque mask elements 12, and transparent phase shifting mask elements 14. Since the phase shifting mask elements 14 are transparent they are much more difficult to inspect for defects. FIG. 3 shows a top vies of a mask having opaque regions 62, 180° phase shift regions 63, 120° phase shift regions 67, 60° phase shift regions 65, and 0° phase shift regions 60.

There are inspection methods using comparison between two dies, die-to-die methods, but it is often desirable to use one die and the image database for inspecting the mask, die-to-database method. The use of a single image detector can also be advantageous.

It is a principle objective of this invention to provide a method of inspecting masks utilizing phase shifting material which will easily detect defects in transparent phase shifting material using a die-to-database inspection and a single image detector.

It is another principle objective of this invention to provide an apparatus for inspecting masks utilizing phase shifting material which will easily detect defects in transparent phase shifting material using a die-to-database inspection and a single image detector.

These objectives are achieved with an apparatus used for inspection of masks having phase shifting material in the mask. The apparatus comprises a light source, an objective lens, a first condenser lens, a transparent reference substrate, a second condenser lens, a phase adjustment unit, and an image divider. The mask to be inspected is placed in a mask holder and positioned between the objective lens and the first condenser lens. The mask comprises phase shifting elements formed on a transparent mask substrate and comprises a number of mask segments. The transparent mask substrate is formed of the same material having the same thickness as the transparent reference substrate. Light from the light source illuminates both the first condenser lens and the second condenser lens. Light illuminating the objective lens first passes through the first condenser lens. Light illuminating the transparent reference substrate first passes through the second condenser lens. The phase adjustment unit is adjusted to provide a 180° phase shift to the light exiting the first objective lens relative to the light exiting the phase adjustment unit.

The first condenser lens, the objective lens, and the mask holder are positioned so that light entering the objective lens passes through the first condenser lens, the transparent mask substrate, and sequentially through each of the mask segments. The second condenser lens and transparent reference substrate are positioned so that light from the second condenser lens passes through the transparent reference substrate. The light exiting the objective lens, after being shifted in phase by 180° by phase adjustment unit, and the light exiting the transparent reference substrate both directed to an image divider.

Light exiting the image divider is directed to a CCD imaging device.

The intensity of the light at the CCD imaging device is proportional to $Cos^2(\delta/2)$, where 6 is the phase angle between light exiting the first objective lens and the light exiting the transparent reference substrate. Since 6 should be 180° plus any phase shift provided by the phase shifting mask elements through which the light has passed the intensity of light at the CCD imaging device is a measure of the amount of phase shift provided by the phase shifting elements. The expected value of the intensity of the light at the CCD imaging device can be determined from the mask image data base. Any deviation of this intensity from the expected value indicates a defect in the mask. In this manner by moving the lenses around the mask the entire mask can be inspected and compared to the image data base.

DESCRIPTION OF THE PREFERRED EMBODIMENTS

Figure 1:
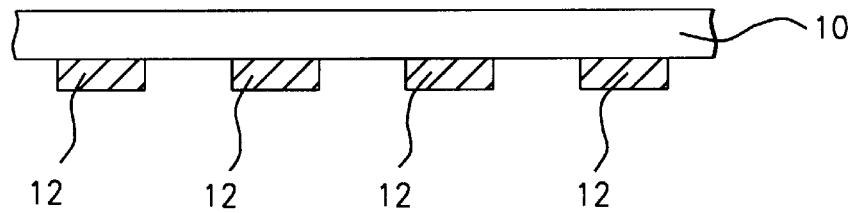
FIG. 1 shows a cross section of a binary mask.
Figure 2:
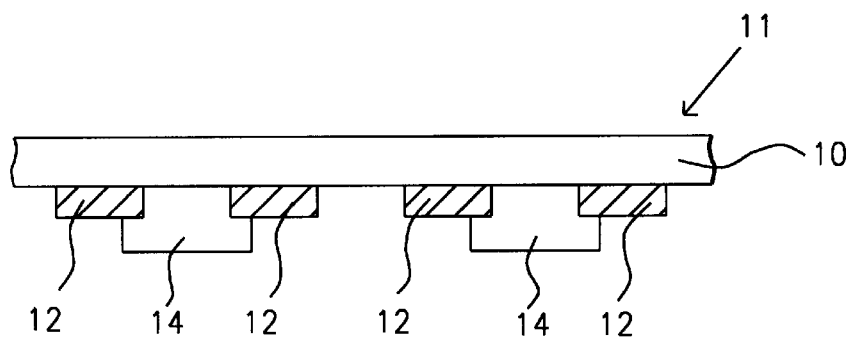
FIG. 2 shows a cross section of a Levenson type phase shifting mask.
Figure 3:
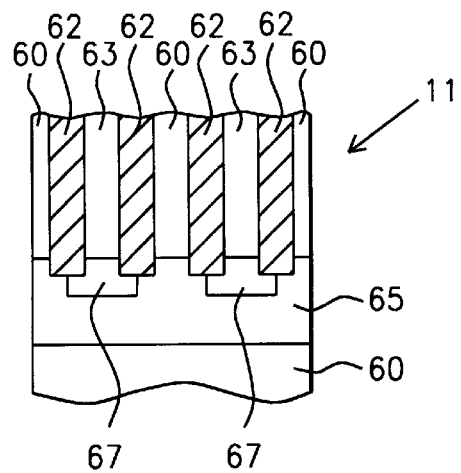
FIG. 3 shows a top view of a mask having opaque regions and phases shift regions of 0°, 60°, 120°, and 180°.
Figure 4:
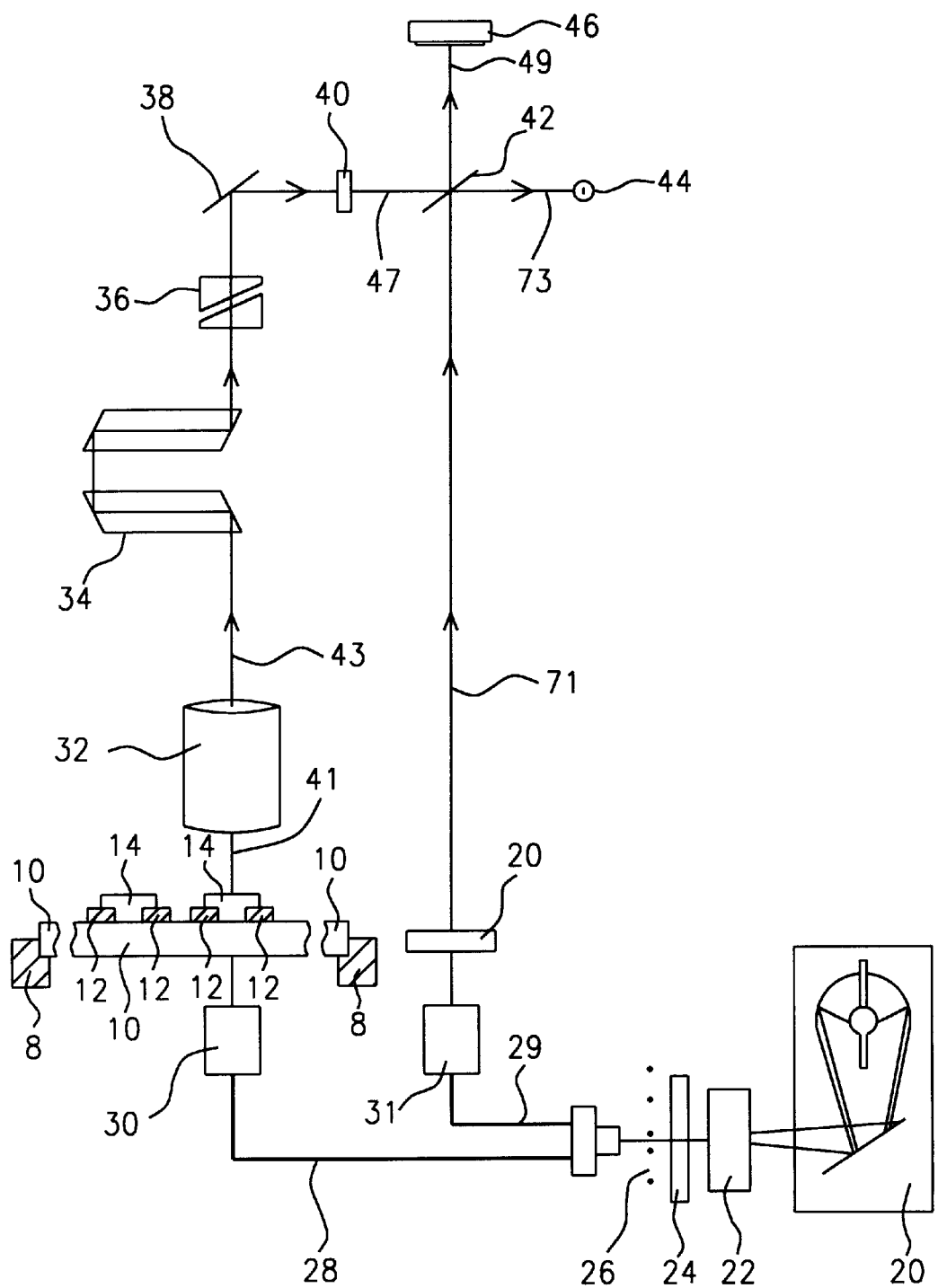
FIG. 4 shows a schematic diagram of the mask inspection apparatus of this invention with a mask under inspection in the mask holder.

Refer now to FIGS. 4–7 for a description of the mask inspection apparatus of this invention. FIG. 4 shows a coherent light source comprising a lamp 20, such as a Hg-Xe lamp, a homogenizer 22, a band pass filter 24, and a grating aperture 26. The coherent light source produces a beam of single phase light. The light from the coherent light source is directed by a first fiber optic cable 28 to a first condenser lens 30 and by a second fiber optic cable 29 to a second condenser lens 31. The light exiting the first condenser lens 30 passes through a mask under inspection 11 held in place by a mask holder 8 into an objective lens 32. FIG. 4 shows the mask positioned so that one of the mask phase shifting elements is directly under the objective lens 32, however the mask holder 8 moves the mask so that all points of the mask to be inspected come under the objective lens 32 in a predetermined sequence during the inspection process. The mask under inspection 11 comprises a transparent mask substrate 10, opaque elements 12 and phase shifting elements 14. The phase shifting elements provide phase shift to the coherent light but are usually transparent. The phase shift is usually a 180° phase shift but other phase shifts, such as 60° and 120°, are also frequently used in phase shift masks.

Figure 5:
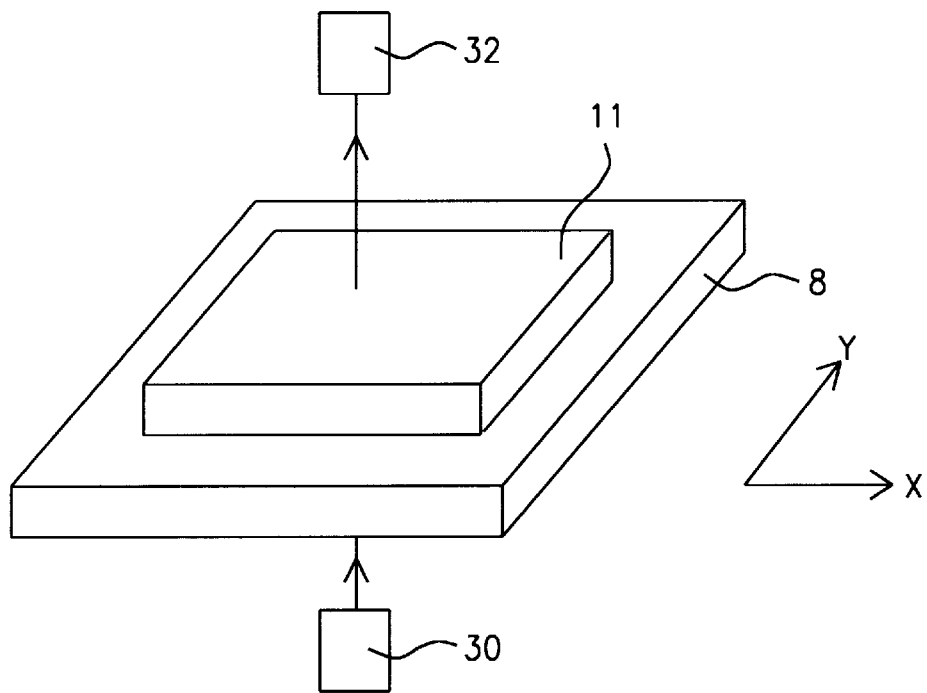
FIG. 5 shows a diagram of the mask under inspection held by the mask holder which can be moved in the XY direction.
Figure 6:
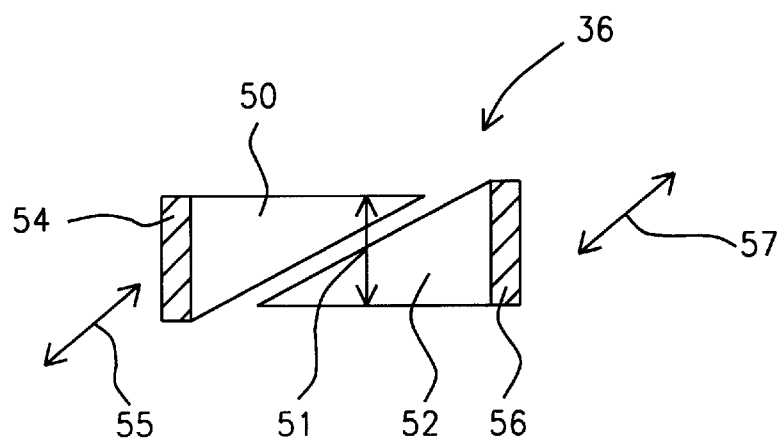
FIG. 6 shows a schematic cross section diagram of the phase adjustment unit of this invention.

As shown in FIG. 5 the mask under inspection 11 is held in place by a mask holder 8 which can be moved in the X and Y directions which are perpendicular to the direction of the light passing through the mask 11. The movement in the X and Y direction allows the entire mask to be observed by the objective lens 32 in a predetermined sequence during the inspection process. Returning again to FIG. 4, The light 41 exiting the mask 11 passes through an objective lens 32. The light 43 exiting the objective lens 32 passes through a parallel prism 34 and enters a phase adjustment unit 36.

The phase adjustment unit 36 can provide a phase adjustment to the coherent light and, in this invention the phase adjustment unit 36 is adjusted to provide a 180° phase shift between the light 43 entering the phase adjustment unit 36 and the light 45 exiting the phase adjustment unit 36. The phase adjustment unit 36 is shown in greater detail in FIG. 6 and comprises a first triangular section 50 of phase shifting material and a second triangular section 52 of phase shifting material. The firs t triangular section 50 is attached to a first holder 55 and can be moved in the direction of the first arrow 55. The second triangular section 52 is attached to a second holder 56 and can be moved in the direction of the second arrow 57. By moving the first triangular section 50 and the second triangular section 52 the thickness 51 of phase shifting material the light will pass through, and thus the phase shift provided to the light, can be varied.

As shown in FIG. 4, the light 45 exiting the phase adjustment unit is reflected by a mirror 38 to a shutter 40. The light 47 exiting the shutter 40 goes to an image divider 42, in this example a split mirror.

The light from the second condenser lens 31 passes through a transparent reference substrate 20 which is formed of the same material and has the same thickness as the transparent mask substrate 10. The light passing through the transparent reference substrate 20 will be shifted in phase by the same amount as the light passing through the transparent mask substrate. The light 71 exiting the transparent reference substrate 20 also goes to the image divider 42, in this example a split mirror. The image divider 42 combines and divides the light entering the image divider producing a first exit beam 49, which is directed to a CCD image sensor 46, and a second exit beam 73, which is directed to a photomultiplier tube 44.

The first light beam 49 and the second light beam have the same intensity which is proportional to $Cos^2(\delta/2)$, where 6 is the phase angle between the light 47 entering the image divider 42 from the mask under test 11, passing through the objective lens 32 and the shutter 40, and the light entering the image divider 42 from the transparent reference substrate 20. Since the phase adjusting unit 36 provides a 180° phase shift and the transparent mask substrate 10 has the same material and thickness as the transparent reference substrate 20, the phase angle δ is equal to 180° plus the phase shift provided by the phase shifting mask element 14 being inspected. If the light passing through the mask is shifted in phase by 180° the light intensity at the CCD image sensor 46 and the photomultiplier tube 44 will be a maximum. If the light passing through the mask is shifted in phase by 0° the light intensity at the CCD image sensor 46 and the photomultiplier tube 44 will be a minimum. The photomultiplier tube 44 is used here only as a convenience to adjust the phase adjusting unit 36 and is not a required part of the inspection apparatus. The adjustment of the phase adjustment unit could be predetermined or calculated.

Figure 7:
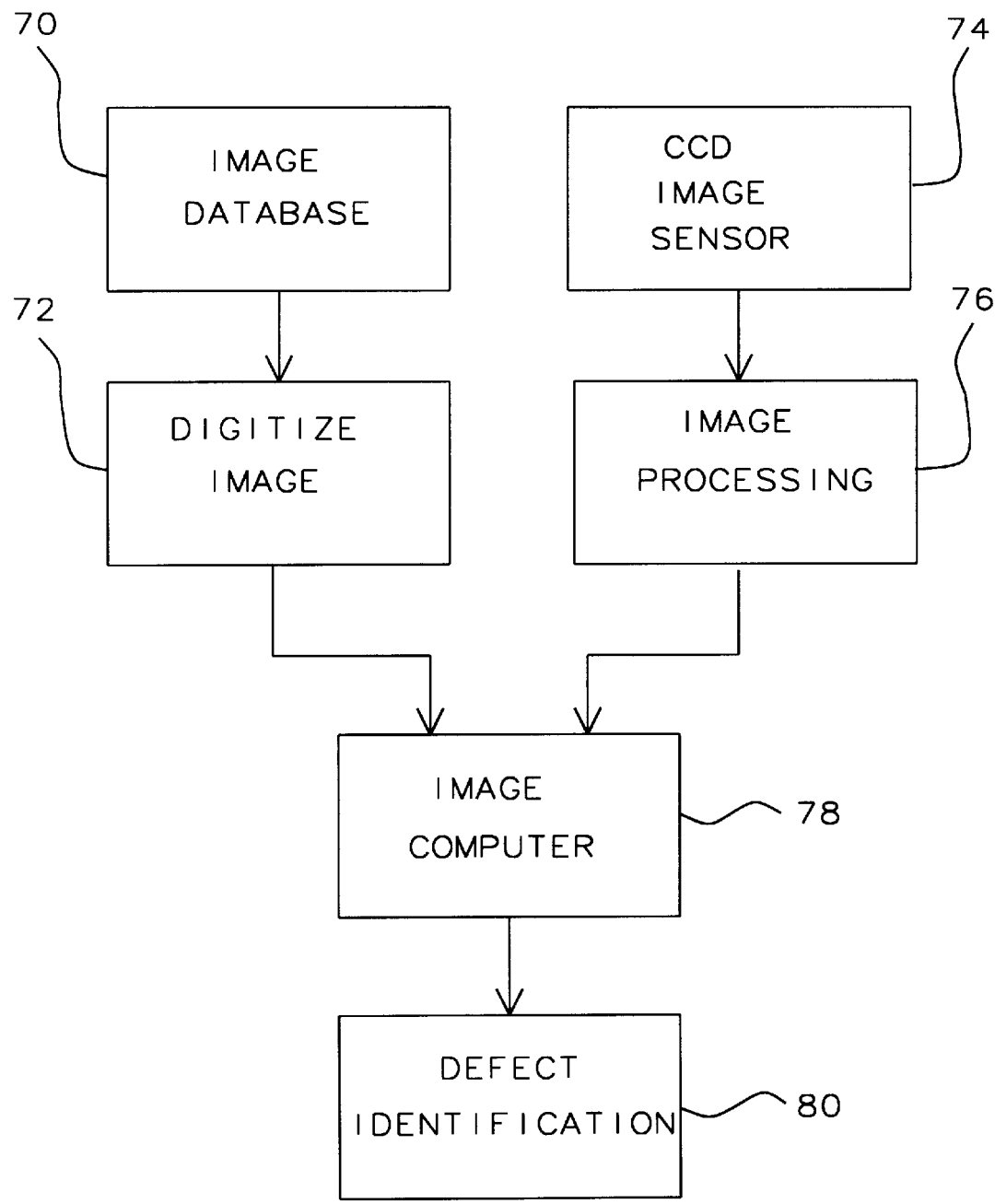
FIG. 7 shows a flow diagram of the method of mask inspection of this invention.

As shown in FIG. 7 the image database 70 of the mask under inspection is fed to an image digitizer unit 72 and then to an image computer 78. The mask under test 11 is moved under the objective lens 32 in a predetermined sequence so that the objective lens 32 views all parts of the mask to be inspected and the CCD image sensor 74 forms an inspection image which is sent to an image processing unit 76 and then to the image computer 78. The image computer 78 compares the image database data from the image digitizer unit 72 and the inspection data from the image processing unit 76 and inputs defect data to the defect identification unit 80 which identifies any defects in the mask under inspection.

Refer again to FIGS. 4 and 7 for a description of the preferred embodiment of the method of inspecting masks of this invention using the apparatus described above. First the mask holder is positioned so that the objective lens 32 views only the transparent mask substrate 10. The phase adjustment unit 36 is then adjusted to produce a minimum at the photomultiplier tube 44, which insures that the phase adjustment unit 36 produces a 180° phase shift. The photomultiplier tube 44 is used only as a convenience for adjusting the phase adjustment unit to a 180° phase shift, and is not a necessary part of the apparatus or method. The adjustment of the phase adjustment unit could be predetermined or calculated. As shown in FIG. 4, the mask under test 11 is then moved in a predetermined sequence so that all parts of the mask to be inspected are viewed by the objective lens 32 which transmits the optical data to the CCD image sensor 46. The CCD image sensor 46 is the only image sensor actually required.

As shown in FIG. 7, the CCD image sensor forms an inspection image which is sent to an image processing unit 76 and then to the image computer 78. The mask image database 70 is fed to the image digitizer 72 to digitize the image database and then to the image computer 78. The image computer 78 compares the image database data from the image digitizer unit 72 and the inspection data from the image processing unit 76 and inputs defect data to the defect identification unit 80 which identifies any defects in the mask under inspection. This inspection method is a die-to-database inspection and a second die is not required.

While the invention has been particularly shown and described with reference to the preferred embodiments thereof, it will be understood by those skilled in the art that various changes in form and details may be made without departing from the spirit and scope of the invention.

What is claimed is:

1. A method of inspecting masks having phase shifting elements, comprising:

providing a coherent light source;

providing an objective lens;

providing a mask holder which can be moved in a predetermined sequence in a single plane;

providing a transparent reference substrate;

directing light from said coherent light source through said transparent reference substrate;

placing a mask having phase shifting mask elements formed on a transparent mask substrate, wherein said mask comprises a number of mask segments and said transparent mask substrate is formed of the same material and has the same thickness as said transparent reference substrate, in said mask holder;

providing an image database for said mask;

moving said mask holder so that light from said coherent light source is directed through each of said mask segments to said objective lens in a predetermined sequence;

directing light from said objective lens through a phase adjustment unit, wherein the phase of the light exiting said phase adjustment unit is shifted in phase by 180° relative to the phase of the light entering said phase adjustment unit;

providing an image divider having a first input, a second input, and an output wherein one half of the light entering said first input of said image divider and one half of the light entering said second input of said image divider exit said output of said image divider;

directing the light exiting said phase adjustment unit to said first input of said image divider;

directing the light exiting said transparent reference substrate to said second input of said image divider;

providing an image acquisition unit having an input and an output;

directing the light exiting said output of said image divider to said input of said image acquisition unit; and comparing said output of said image acquisition unit and said image database of said mask, thereby identifying defects in said mask.

2. The method of claim 1 wherein said comparing said output of said image acquisition unit and said image database of said mask comprises:

providing an image processing unit having an input and an output;

providing an image digitizer unit having an input and an output;

providing an image computer having a first input, a second input, and an output;

providing a defect identification unit having an input;

directing said output of said image acquisition unit to said input of said image processing unit;

directing said image database to said input of said image digitizer unit;

directing said output of said image digitizer unit to said first input of said image computer and said output of said image processing unit to said second input of said image computer; and directing said output of said image computer to said defect identification unit, thereby identifying defects in said mask.

3. The method of claim 1 wherein said image divider comprises a split mirror.

4. The method of claim 1 wherein said image acquisition unit comprises a CCD imaging device.

5. The method of claim 1 wherein said transparent reference substrate is formed of quartz.

6. The method of claim 1 wherein said phase shifting mask elements provide a phase shift of 180°.

7. The method of claim 1 wherein said phase shifting mask elements provide phase shifts of 60°, 120°, or 180°.

8. The method of claim 1 wherein said coherent light source comprises a Hg-Xe lamp, a homogenizer, a band pass filter, a grating aperture, a first fiber optic link, a second fiber optic link, a first condenser lens, and a second condenser lens.

9. The method of claim 1 wherein said phase adjustment unit comprises a first triangular section of phase shifting material and a second triangular section of phase shifting material which can be moved relative to each other.

10. An apparatus for inspecting masks having phase shifting elements, comprising:

a coherent light source;

a mask holder which can be moved in a predetermined sequence in a single plane;

an image divider having a first input, a second input, and an output wherein one half of the light entering said first input of said image divider and one half of the light entering said second input of said image divider exit said output of said image divider, wherein said image divider is placed so that said mask holder is between said coherent light source and said image divider;

an objective lens placed between said image divider and said mask holder;

a transparent reference substrate placed between said coherent light source and said second input of said image divider so that light passing through said transparent reference substrate enters said second input of said image divider without passing through said mask holder or said objective lens;

a phase adjustment unit placed between said objective lens and said first input of said image divider, wherein the light exiting said objective lens enters said first input of said image divider, after passing through said phase adjustment unit, with a 180° phase shift relative to the light entering said second input of said image divider;

an image acquisition unit, having an input and an output, positioned so that the output of said image divider enters said input of said image acquisition unit; and means for comparing said output of said image acquisition unit to the image database of a mask placed in said mask holder, thereby identifying defects in the mask placed in said mask holder.

11. The apparatus of claim 10 wherein said means for comparing said output of said image acquisition unit to the image database of a mask placed in said mask holder comprises:

an image processing unit having an input and an output, wherein said input of said image processing unit is connected to said output of said image acquisition unit;

an image digitizer unit having an input and an output, wherein the image database of a mask placed in said mask holder is fed to said input of said image digitizer;

an image computer having a first input, a second input, and an output, wherein said first input of said image computer is connected to said output of said image digitizer unit and said second input of said image computer is connected to said output of said image processing unit; and a defect identification unit having an input connected to said output of said image computer, wherein defects in a mask placed in said mask holder can be identified.

12. The apparatus of claim 10 wherein said image divider comprises a split mirror.

13. The apparatus of claim 10 wherein said image acquisition unit comprises a CCD imaging device.

14. The apparatus of claim 10 wherein said transparent reference substrate is formed of quartz.

15. The apparatus of claim 10 wherein said coherent light source comprises a Hg-Xe lamp, a homogenizer, a band pass filter, a grating aperture, a first fiber optic link, and a second fiber optic link.

16. The apparatus of claim 10 wherein said phase adjustment unit comprises a first triangular section of phase shifting material and a second triangular section of phase shifting material which can be moved relative to each other.

* * * * *